(12) United States Patent
Yang

(10) Patent No.: US 7,231,701 B1
(45) Date of Patent: Jun. 19, 2007

(54) MODULAR PCB AND METHOD OF REPLACING A MALFUNCTIONED MODULE OF THE PCB

(76) Inventor: Ho-Ching Yang, No. 4, Lung 8, Alley 32, Lane 282, Ping Tung Rd., Ping Chen City, Taoyuan Hsien (TW)

( * ) Notice: Subject to any disclaimer, the term of this patent is extended or adjusted under 35 U.S.C. 154(b) by 0 days.

(21) Appl. No.: 11/326,476

(22) Filed: Jan. 6, 2006

(51) Int. Cl.
*B23P 6/00* (2006.01)

(52) U.S. Cl. .............................. 29/402.11; 29/402.08; 29/402.09; 29/402.12; 29/402.13; 29/825; 29/832

(58) Field of Classification Search ............. 29/402.08, 29/402.09, 402.11, 402.12, 402.13, 825, 832
See application file for complete search history.

(56) References Cited

U.S. PATENT DOCUMENTS 5,313,699 A * 5/1994 Freige et al. ................. 29/832
6,693,816 B2 * 2/2004 Brunelle et al. ............... 365/63
2003/0016040 A1 * 1/2003 Brunelle et al. ............ 324/755

FOREIGN PATENT DOCUMENTS

JP          2001-352143       * 12/2001

* cited by examiner

*Primary Examiner*—Carl J. Arbes
(74) *Attorney, Agent, or Firm*—Leong C. Lei

(57) ABSTRACT

Modular PCB and method of replacing one of a plurality of modules of a first PCB are provided. One embodiment of the method includes checking each module of the first PCB and each of a plurality of modules of a second PCB, cutting a malfunctioned module from the first PCB to leave a rectangular vacant area if the malfunctioned module is found, forming a plurality of indents on each side of the vacant area, cutting a good module from the second PCB if the good module is found, forming a plurality of projections on each side of the good module, placing the good module in the vacant area for coupling the indents and the projections, and applying adhesive (e.g., resin) into the coupled indents and projections for fastening the good module in the vacant area.

7 Claims, 7 Drawing Sheets

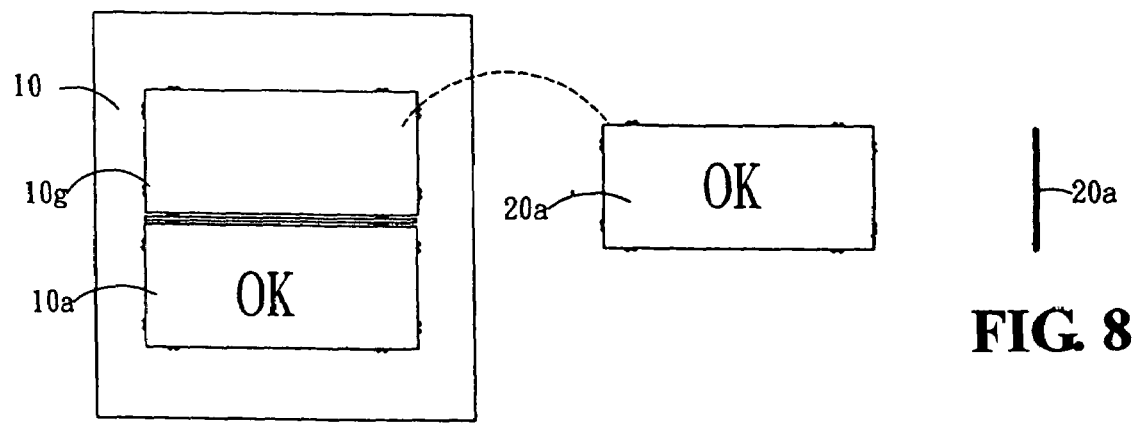
FIG. 6
FIG. 8
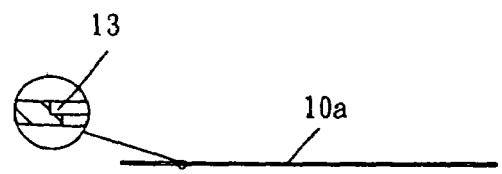
FIG. 7

MODULAR PCB AND METHOD OF REPLACING A MALFUNCTIONED MODULE OF THE PCB

BACKGROUND OF THE INVENTION (a) Technical Field of the Invention

The present invention relates to PCBs (printed circuit boards) and more particularly to a modular PCB and a method of replacing a malfunctioned module of the PCB with improved characteristics (e.g., reliable fastening, high precision, high quality, etc.)

(b) Description of the Prior Art

For saving precious resources and for the sake of environmental protection, recycling malfunctioned PCBs has been implemented for years. One typical method associated with this involves the steps of cutting a good module from a PCB, cutting a malfunctioned module from another PCB, and placing the good module in a vacant area previously occupied by the malfunctioned module and securing same. In detail, a plurality of T-shaped recesses are formed on the vacant area and a plurality of T-shaped tabs are formed on the good module. The tabs are adapted to engage with the recesses. Also, adhesive is applied for coupling them together after placing the good module in the vacant area.

However, the prior technique suffered from several disadvantages. For example, the desired mating coupling of the tabs and the recesses is not made possible due to limitations of the existing machines. Further, high temperature in the manufacturing processes tends to deform the PCBs. And in turn, it may adversely affect the structural strength of PCB. Further, precision is poor. Hence, a need has arisen for improved PCB construction and method of replacing a malfunctioned module of the PCB in order to overcome the inadequacies of the prior art.

SUMMARY OF THE INVENTION

The primary purpose of the present invention is to provide a PCB comprising a plurality of rectangular recesses each including a plurality of indents on each side; and a plurality of modules dimensioned and shaped to fit in the recesses, each module comprising a plurality of projections on each side; wherein the projections are adapted to engage with the indents.

It is another object of the present invention to provide a method of replacing one of a plurality of modules of a first PCB, comprising the steps of checking each module of the first PCB and each of a plurality of modules of a second PCB; cutting a malfunctioned module from the first PCB to leave a rectangular vacant area if the malfunctioned module is found; forming a plurality of indents on each side of the vacant area; cutting a good module from the second PCB if the good module is found; forming a plurality of projections on each side of the good module; placing the good module in the vacant area to couple with the indents and the projections; and applying adhesive into the coupled indents and projections for fastening the good module in the vacant area.

It is a further object of the present invention to provide a method of replacing one of a plurality of modules of a first PCB, comprising the steps of checking each module of the first PCB and each of a plurality of modules of a second PCB; cutting a malfunctioned module from the first PCB to leave a rectangular vacant area if the malfunctioned module is found; forming a cavity on each side of the vacant area; cutting a good module from the second PCB if the good nodule is found; forming an extension on each side of the good module; placing the good module in the vacant area for coupling the cavity and the extension; and applying adhesive into the coupled cavity and extension for fastening the good module in the vacant area.

In one aspect of the present invention the adhesive is resin.

In another aspect of the present invention both the indents and the projections are shaped as curves, triangles, or squares.

The foregoing object and summary provide only a brief introduction to the present invention. To fully appreciate these and other objects of the present invention as well as the invention itself, all of which will become apparent to those skilled in the art, the following detailed description of the invention and the claims should be read in conjunction with the accompanying drawings. Throughout the specification and drawings identical reference numerals refer to identical or similar parts.

Many other advantages and features of the present invention will become manifest to those versed in the art upon making reference to the detailed description and the accompanying sheets of drawings in which a preferred structural embodiment incorporating the principles of the present invention is shown by way of illustrative example.

BRIEF DESCRIPTION OF THE DRAWINGS

FIG. 6 is a schematic top view of a portion of one PCB illustrating a placing of a good module from the other PCB in a vacant area previously occupied by a malfunctioned module of one PCB according to a second preferred embodiment of the invention;

FIG. 7 is a transverse sectional view of the PCB in FIG. 6;

FIG. 8 is a longitudinal sectional view of the good module in FIG. 6;

DETAILED DESCRIPTION OF THE PREFERRED EMBODIMENTS

Figure 1:
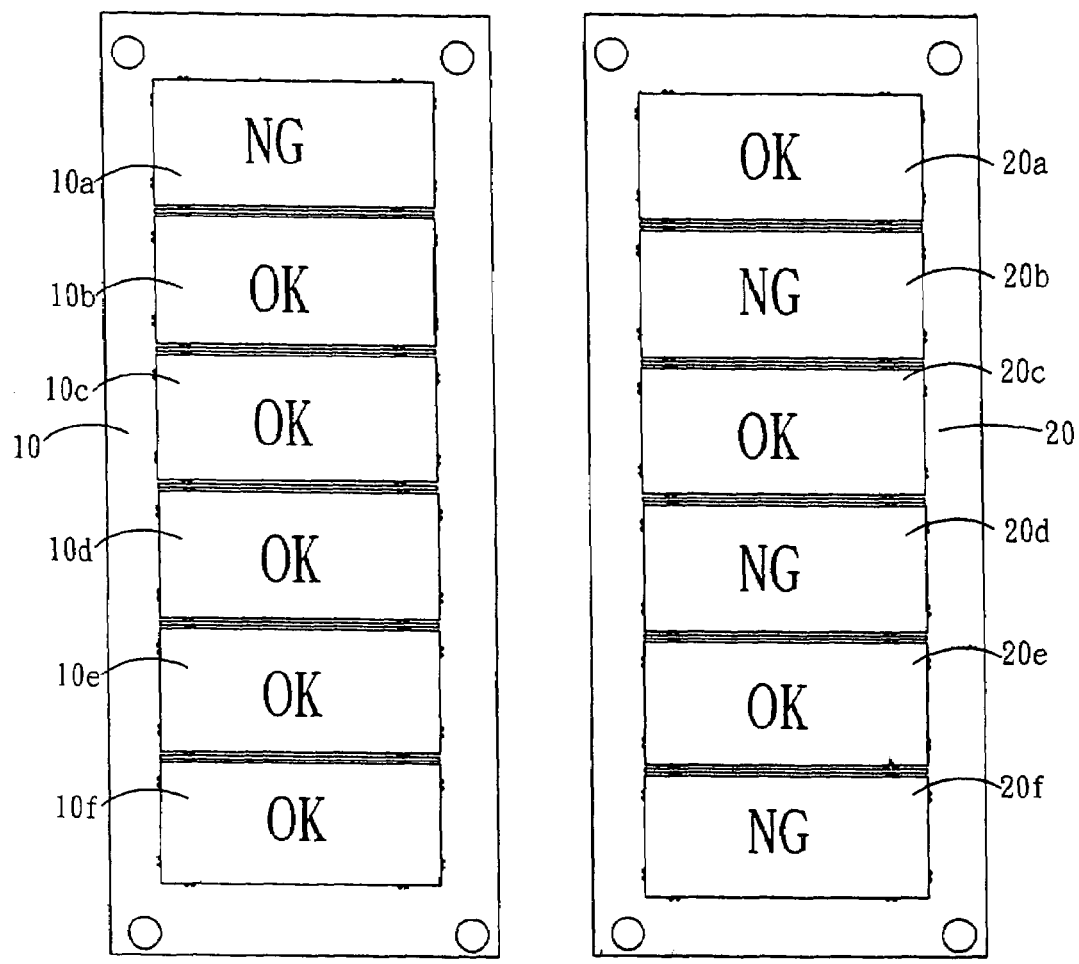
FIG. 1 is a schematic top view of portions of two modular PCBs after being checked according to a first preferred embodiment of the invention.
Figure 2:
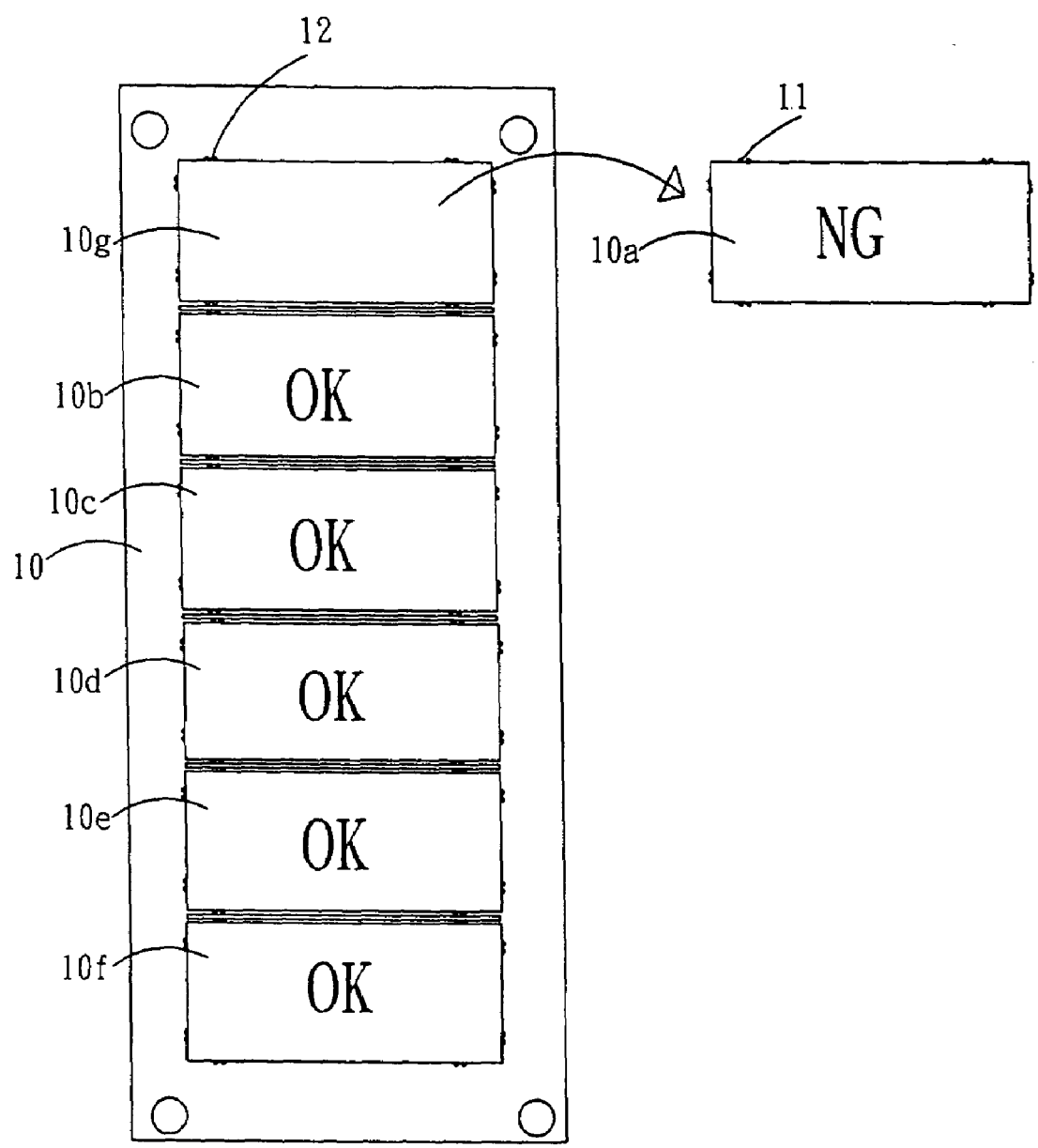
FIG. 2 depicts a removal of the malfunctioned module of one PCB.
Figure 3:
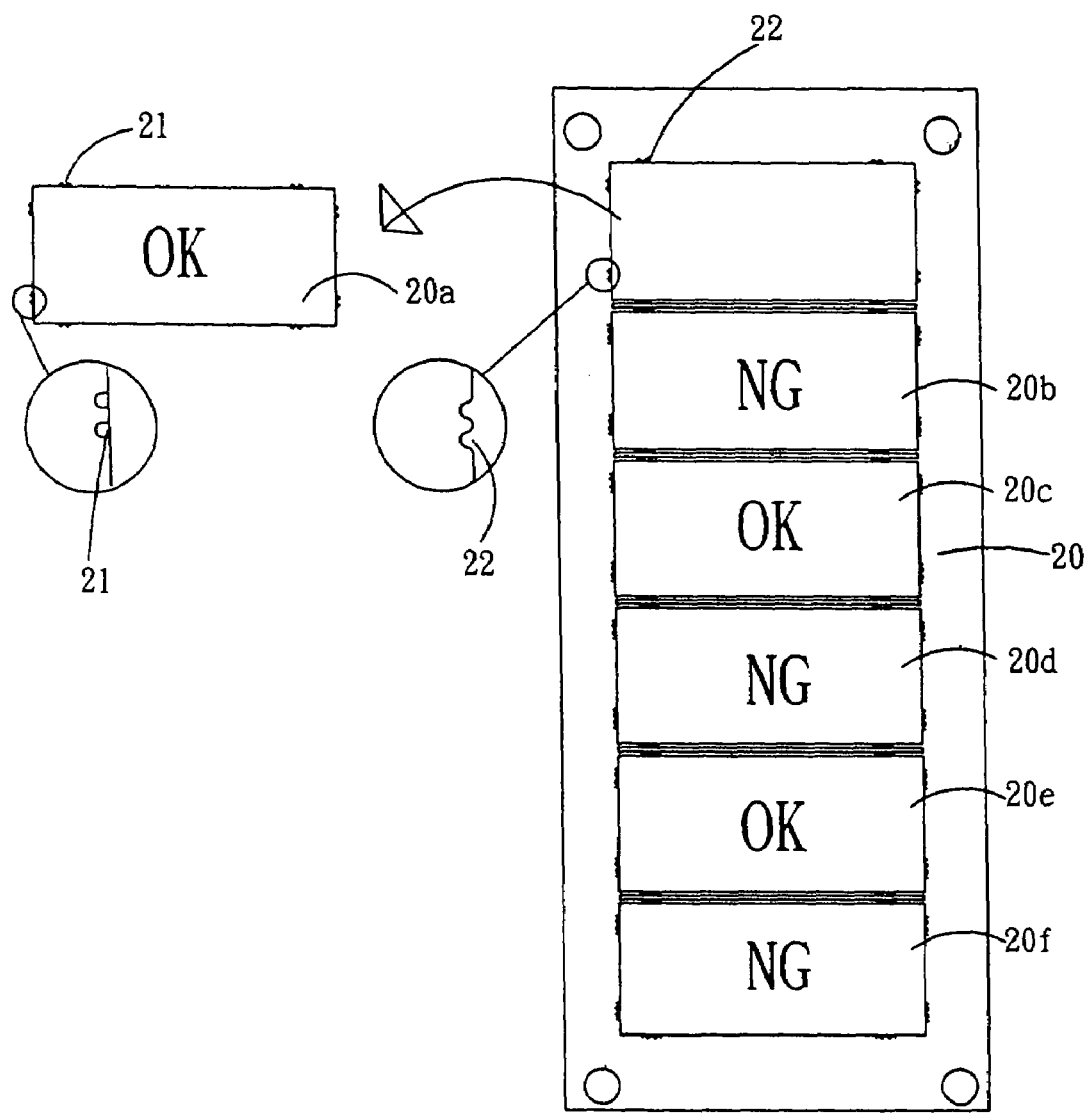
FIG. 3 depicts a removal of the good module of the other PCB.
Figure 4:
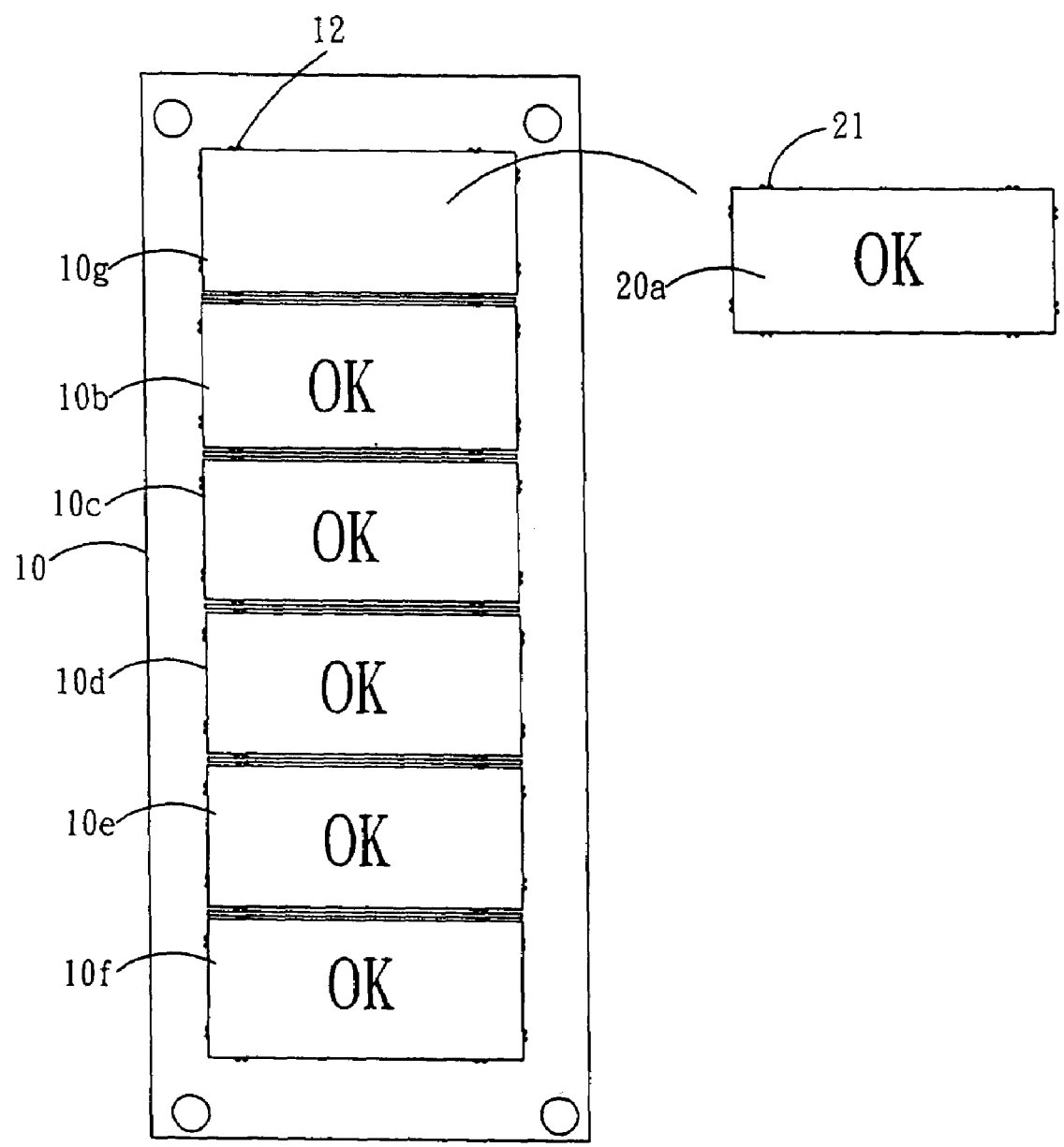
FIG. 4 is a schematic top view of a portion of one PCB prior to placing the good module in a vacant area thereof in which the vacant area was previously occupied by the malfunctioned module thereof.

The following descriptions are of exemplary embodiments only, and are not intended to limit the scope, applicability or configuration of the invention in any way. Rather, the following description provides a convenient illustration for implementing exemplary embodiments of the invention. Various changes to the described embodiments may be made in the function and arrangement of the elements described without departing from the scope of the invention as set forth in the appended claims.

Referring to FIGS. 1 to 5, a first preferred embodiment of the invention is illustrated. A modular PCB 10 comprises a plurality of rectangular modules 10a, 10b, 10c, 10d, 10e, and 10f. The module 10a is malfunctioned (e.g., one labeled as "NG") and the remaining modules are good (e.g., ones labeled as "OK") after checking. Next, cut the malfunctioned module 10a from the PCB 10 to leave a rectangular vacant area 10g. Next, check the other modular PCB 20 comprising a plurality of rectangular modules 20a, 20b, 20c, 20d, 20e, and 20f. The modules 20b, 20d, and 20f are malfunctioned (e.g., ones labeled as "NG") and the remaining modules 20a, 20c, and 20e are good (e.g., ones labeled as "OK") after checking. Next, cut the good modules 20a, 20c, and 20e from the PCB 20. On each of four edges of the vacant area 10g, there are formed with two pairs of indents 22. Also, two pairs of projections 21 are formed on each of four edges of the good module 20a. The indents 22 and the projections 21 are shaped as wave, triangles, squares, or the like.

Figure 5:
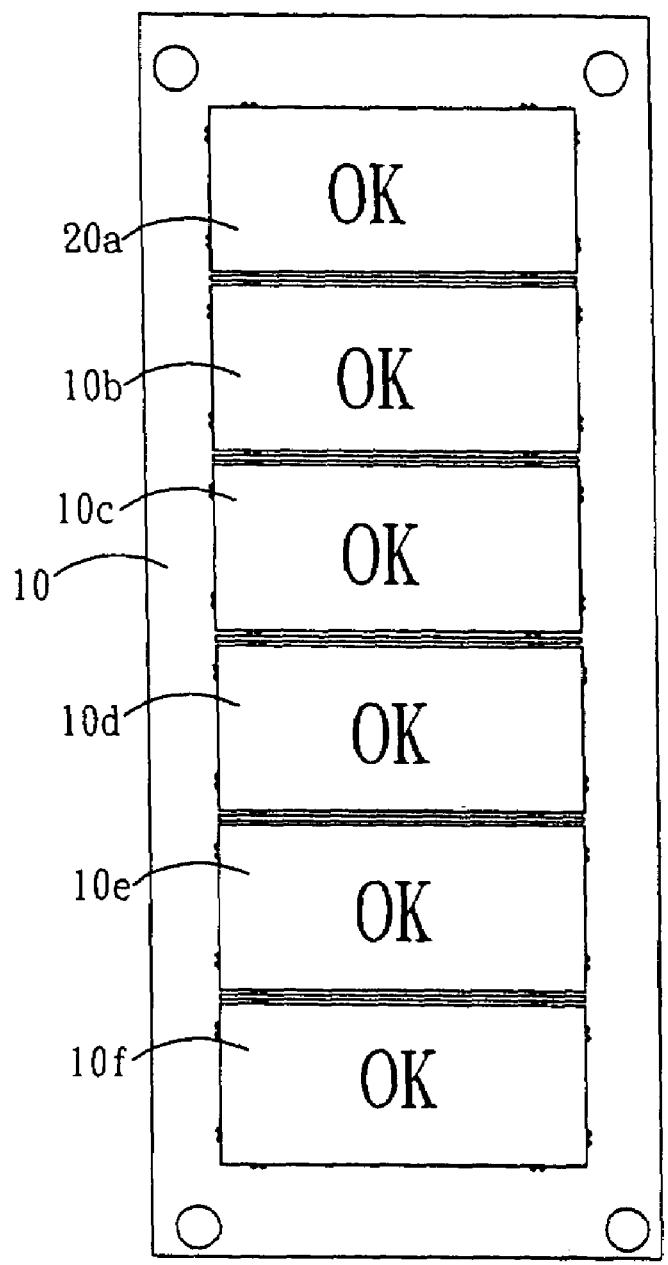
FIG. 5 is a view similar to FIG. 4 where the good module has been placed in the vacant area.
Figure 9:
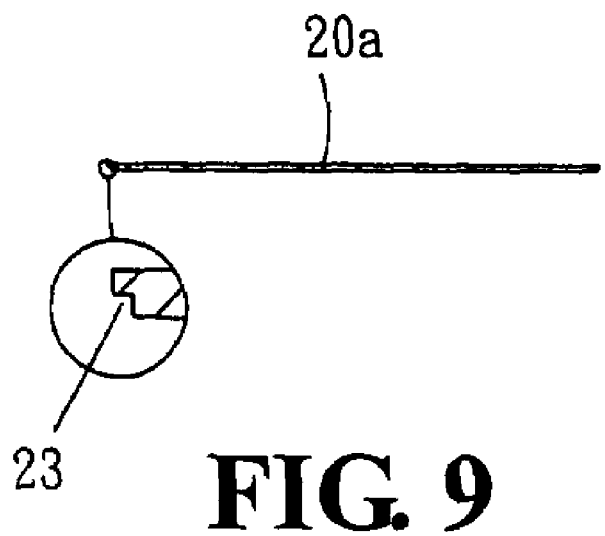
FIG. 9 is a transverse sectional view of the good module in FIG. 6.
Figure 10:
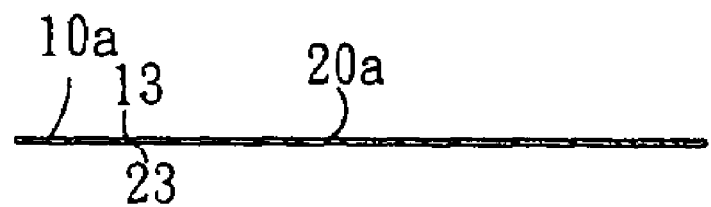
FIG. 10 is a transverse sectional view of FIG. 6 with the good module placed in the vacant area at the end of replacement.

A process of replacing a malfunctioned module of a modular PCB comprises the steps of checking each of a plurality of modules of modular first and second PCBs (see FIG. 1); cutting a malfunctioned module from the first PCB to leave a rectangular vacant area if the malfunctioned module is found; forming a plurality of pairs of indents on each edge of the vacant area (see FIGS. 2 and 3); cutting a good module from the second PCB if the good module is found; forming a plurality of pairs of projections on each edge of the good module (see FIGS. 2 and 3); placing the good module in the vacant area for coupling the indents and the projections (see FIG. 4); and applying adhesive into the coupled indents and projections for fastening the good module in the vacant area (see FIG. 5). Preferably, the adhesive is resin.

Referring to FIGS. 6 to 10, a second preferred embodiment of the invention is illustrated. The characteristics of the second preferred embodiment are detailed below. The vacant area 10g is relatively small. A cavity 13 is formed on each edge of the vacant area 10g of one modular PCB 10. An extension 23 is formed on each edge of a good module 20a of the other modular PCB 20. The extensions 23 are adapted to engage with the cavities 13 when the good module 20a is placed in the vacant area 10g. Thereafter, apply adhesive into the coupled cavities 13 and extensions 23 for fastening the good module 20a in the vacant area 10g.

In brief, we can view each module as a piece and view the PCB comprising a plurality of modules as a panel. Thus, replacing a malfunctioned module with a good module will greatly decrease the manufacturing cost. Also, the fastening is reliable, the precision is high, and the quality is good.

It will be understood that each of the elements described above, or two or more together may also find a useful application in other types of methods differing from the type described above.

While certain novel features of this invention have been shown and described and are pointed out in the annexed claim, it is not intended to be limited to the details above, since it will be understood that various omissions, modifications, substitutions and changes in the forms and details of the device illustrated and in its operation can be made by those skilled in the art without departing in any way from the spirit of the present invention.

I claim:

1. A method of replacing one of a plurality of modules of a first PCB, comprising the steps of:
    checking each module of the first PCB and each of a plurality of modules of a second PCB;
    cutting a malfunctioned module from the first PCB to leave a rectangular vacant area if the malfunctioned module is found;
    forming a plurality of indents on each side of the vacant area;
    cutting a good module from the second PCB if the good module is found;
    forming a plurality of projections on each side of the good module;
    placing the good module in the vacant area for coupling the indents and the projections; and
    applying adhesive into the coupled indents and projections for fastening the good module in the vacant area.

2. The method of claim 1, wherein the adhesive is resin.

3. The method of claim 1, wherein both the indents and the projections are shaped as curves.

4. The method of claim 1, wherein both the indents and the projections are shaped as triangles.

5. The method of claim 1, wherein both the indents and the projections are shaped as squares.

6. A method of replacing one of a plurality of modules of a first PCB, comprising the steps of:
    checking each module of the first PCB and each of a plurality of modules of a second PCB;
    cutting a malfunctioned module from the first PCB to leave a rectangular vacant area if the malfunctioned module is found;
    forming a cavity on each side of the vacant area;
    cutting a good module from the second PCB if the good module is found;
    forming an extension on each side of the good module;
    placing the good module in the vacant area for coupling the cavity and the extension; and
    applying adhesive into the coupled cavity and extension for fastening the good module in the vacant area.

7. The method of claim 6, wherein the adhesive is resin.

* * * * *